US010928472B2

(12) United States Patent
Furman et al.

(10) Patent No.: US 10,928,472 B2
(45) Date of Patent: Feb. 23, 2021

(54) SYSTEM AND METHOD FOR BRAIN STATE CLASSIFICATION

(71) Applicant: TECHNION RESEARCH AND DEVELOPMENT FOUNDATION LTD., Haifa (IL)

(72) Inventors: Daniel Furman, Tel Aviv-Jaffa (IL); Hillel Pratt, Nofit (IL)

(73) Assignee: TECHNION RESEARCH & DEVELOPMENT FOUNDATION LIMITED, Haifa (IL)

( * ) Notice: Subject to any disclaimer, the term of this patent is extended or adjusted under 35 U.S.C. 154(b) by 769 days.

(21) Appl. No.: 15/407,398

(22) Filed: Jan. 17, 2017

(65) Prior Publication Data

US 2017/0202518 A1 Jul. 20, 2017

Related U.S. Application Data

(60) Provisional application No. 62/278,692, filed on Jan. 14, 2016.

(51) Int. Cl.
*G01R 33/48* (2006.01)
*G06F 3/01* (2006.01)
*G06K 9/00* (2006.01)

(52) U.S. Cl.
CPC ......... *G01R 33/4806* (2013.01); *G06F 3/015* (2013.01); *G06K 9/00536* (2013.01); *G06K 9/00885* (2013.01); *G06F 2203/011* (2013.01); *G06K 2009/00939* (2013.01)

(58) Field of Classification Search
CPC .......... G01R 33/4806; G06K 9/00536; G06K 9/00885; G06K 2009/00939; G06F 3/015; G06F 2203/011
See application file for complete search history.

(56) References Cited

U.S. PATENT DOCUMENTS

| | | | | |
|---|---|---|---|---|
| 2005/0267597 A1* | 12/2005 | Flaherty | ............... | A61B 5/0031 623/24 |
| 2007/0016095 A1* | 1/2007 | Low | ..................... | A61B 5/4812 600/544 |
| 2018/0310855 A1* | 11/2018 | Connor | ................ | A61B 5/0478 |

OTHER PUBLICATIONS

Anna Lorena et al., "Comparing Techniques for Multiclass Classification Using Binary SVM Predictors". R. Monroy et al. (Eds.): MICAI 2004, LNAI 2972, pp. 272-281, 2004, viewed on Mar. 20, 2020.*

* cited by examiner

*Primary Examiner* — Christopher Koharski
*Assistant Examiner* — James Moss
(74) *Attorney, Agent, or Firm* — Pearl Cohen Zedek Latzer Baratz LLP

(57) ABSTRACT

A method for creating brain-machine interface based on received and filtered brain signals from a subject, classifying the filtered signals to classes of brain states, detecting one brain state from the classified brain states and executing by a machine a command that corresponds to the detected state.

7 Claims, 13 Drawing Sheets
(5 of 13 Drawing Sheet(s) Filed in Color)

SYSTEM AND METHOD FOR BRAIN STATE CLASSIFICATION

CROSS-REFERENCE TO RELATED APPLICATIONS

This application claims priority of U.S. Patent Application No. 62/278,692, filed Jan. 14, 2016 and entitled SYSTEM AND METHOD FOR BRAIN STATE CLASSIFICATION, which is incorporated herein by reference.

FIELD OF THE INVENTION

The present invention relates to brain-machine interfaces. More particularly, the present invention relates to systems and methods for classification of brain states for a brain-machine interface and to embodiments useful to identify and approve person's identity based on brain states.

BACKGROUND OF THE INVENTION

Paralysis caused by spinal cord injury, amyotrophic lateral sclerosis, brainstem stroke, cerebral palsy, and other disorders of the nervous system, has a severe impact on the lives of millions of individuals world-wide. While many assistive technologies have been developed for vulnerable or high risk populations, the emerging class of technologies known as brain-machine interfaces (BMIs) has a substantial potential to improve their quality of life. BMIs are often directed at assisting, augmenting, or repairing human cognitive or sensory-motor functions.

This is because BMIs are a platform upon which additional assistive technologies may be built, since BMIs open a channel of engagement with one's surroundings that can be used to make possible such goals as basic as opening a door, or as complex as writing and sending an email. By providing paralyzed individuals the ability to bypass their body entirely and dynamically interact with their environment through thought alone, BMIs can profoundly remedy communicative deficits, navigational difficulties, and facilitate many other professional and recreational activities.

The types of BMI systems are typically divided into two overarching categories of invasive and non-invasive BMIs, corresponding to the manner in which brain signals are acquired. Invasive BMIs entail the implantation of microelectrode arrays, either directly into brain structures or atop the brain's surface. These systems have demonstrated significant success and done much to progress fundamental neuroscience. However, at present, only those patients with the most severe disabilities can be studied because of an ethical barrier due to the need for a surgical procedure to position the electrodes that involves opening the skull, and has been shown to cause both acute and chronic trauma at the site of electrode insertion.

The second category of BMI systems consists of the non-invasive varieties that make use of scalp electrophysiology, or other data acquisition methodologies that do not require the implantation of microelectrode arrays (for example, near-infrared spectroscopy or magnetoencephalography). These systems are readily used in basic research and may be applied more immediately in clinic as the associated barriers are significantly lower. The promise of these systems is accordingly higher for a broader population of patients, who may be affected by a wide array of paralytic maladies, ranging from hand hemiparesis to locked-in syndrome. The noninvasive systems might provide new paradigms that may be implemented with relative ease, such that healthy populations may be studied and also benefit from BMI applications, in addition to patient populations.

In the domain of non-invasive BMI control, the classification of imagined movements (i.e., motor imagery) offers the greatest promise for increasing the degrees of freedom of current systems so as to enable additional features, for these interface systems. However, currently known solutions can only provide accuracy in distinguishing between brain states driven by large regions of activation such that subtle imagined movements cannot be classified.

Brain states are classes of neural activity patterns associated with specific brain functions. Sensorimotor concepts such as "perceiving stimulus A" or "doing action B" are, for example, associated with different brain states. Cognitive concepts, such as 'attention', 'learning', 'forgetting', and 'fatigue' likewise pertain to distinct brain states. Medical concepts, such as 'disease', 'healthy', 'seizure', 'disorder' similarly are associated with corresponding brain-states. In a single day, humans experience highly variable numbers of brain-states. Two states are especially prominent: 'wakefulness' and 'sleep'. The brain-states of 'wakefulness' and 'sleep' (being of broader scale brain states) have many subsets, for example, 'sleep' may be subdivided into several discrete stages such as "slow-wave sleep" and "rapid-eye movement (REM) sleep" while 'wakefulness' may be divided further into a vast array of sensorimotor, cognitive, and other brain-states. Optionally, several "micro-scale states" (e.g., slow-wave sleep) may be combined to define further "macro-scale states".

While some known solutions are aimed at the study and classification of brain states for voluntary movement of body parts as well as imagined movement of large body parts, accurate decoding of brain activity associated with imagined subtle movements has yet to be provided, for example as described by Wolpaw, J., Wolpaw, E. W. "Brain-Computer Interfaces: principles and practice", Oxford University Press, 2012.

SUMMARY OF THE INVENTION

A method of creating a brain-machine interface is disclosed comprising receiving brain signals from a subject, with at least one sensor, filtering noise from the received signals, classifying the filtered data into predetermined classes of brain states, detecting a received brain state from the classified brain states and executing, by the machine, a command corresponding to the detected state, wherein the filtering comprises normalization and selection of windows through an automatic cross-validation evaluation procedure, and wherein the classification is carried out dynamically.

According to some embodiments, the method further comprises positioning at least one sensor in proximity to the subject.

According to some additional embodiments, the method further comprises displaying a command corresponding to the detected state.

According to some embodiments, the brain signals are received using at least one of Electroencephalography (EEG), functional magnetic resonance imaging (fMRI), Electromyography (EMG), Electrooculography (EOG), Electrocorticography (ECoG), Magnetoencephalography (MEG), and Near-infrared spectroscopy (NIRS).

According to some additional embodiments, the method further comprises checking that received data is in appropriate format for brain signals.

According to some embodiments, the predetermined classes of brain states comprise at least one of right thumb press, left thumb press, any other finger(s) press, fatigued, attentive, asleep, awake, depressive, manic, learning, forgetting, fixated on target, distracted, seizure, deaf, 'Yes', and 'No'.

According to some additional embodiments, the method further comprises performing calibration by linking pre-defined classes to brain signals for particular movements of the subject.

According to some additional embodiments, the method further comprises extracting invariant features of the filtered signals, and normalizing the extracted features.

A brain-machine interface system is disclosed comprising a monitoring device, comprising at least one sensor adapted to detect brain signals, a processor, in communication with the monitoring device, wherein the processor is to analyze the signals detected by the at least one sensor, a classification module, coupled to the processor, the classification module to classify brain states corresponding to the analyzed signals and a user interface, couple to the processor, the user interface to execute commands corresponding to a deduced state from the classification module, wherein the processor is further configured to detect brain signals corresponding to imaginary movement.

According to some embodiments, the monitoring device is wearable and configured to fit onto the head of a subject.

According to some embodiments, the system further comprises a plurality of sensors that are spatially distributed at the monitoring device.

According to some embodiments, the system further comprises a signal acquisition module to receive signals detected by the at least one sensor.

According to some embodiments, the classification module comprises a multi-class support vector machine (SVM) classifier.

According to some embodiments, the communication between the processor and the monitoring device is wireless.

According to some embodiments, a method of identifying authorized users is disclosed comprising receiving brain signals from a user when the user enters a sequence of characters via a keyboard, with at least one sensor and as received in response to a character selection performed by at least one finger of the user, filtering noise from the received signals, detecting a received brain state from the filtered data, comparing the detected brain state to a pre-stored brain state associated with brain signals received when an authorized person entered this characters' sequence and determining if the detected brain state corresponds to an authorized brain state, wherein the pre-stored brain state associated with brain signals received when an authorized person entered this characters' sequence is based on brain signals received when the defined sequence of characters is punched by anyone of the user's fingers, one each time.

According to some embodiments, the method further comprises positioning at least one sensor in proximity to the subject.

According to some embodiments, the method further comprises recording for each authorized user at least one brain signal corresponding to a predetermined activity.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
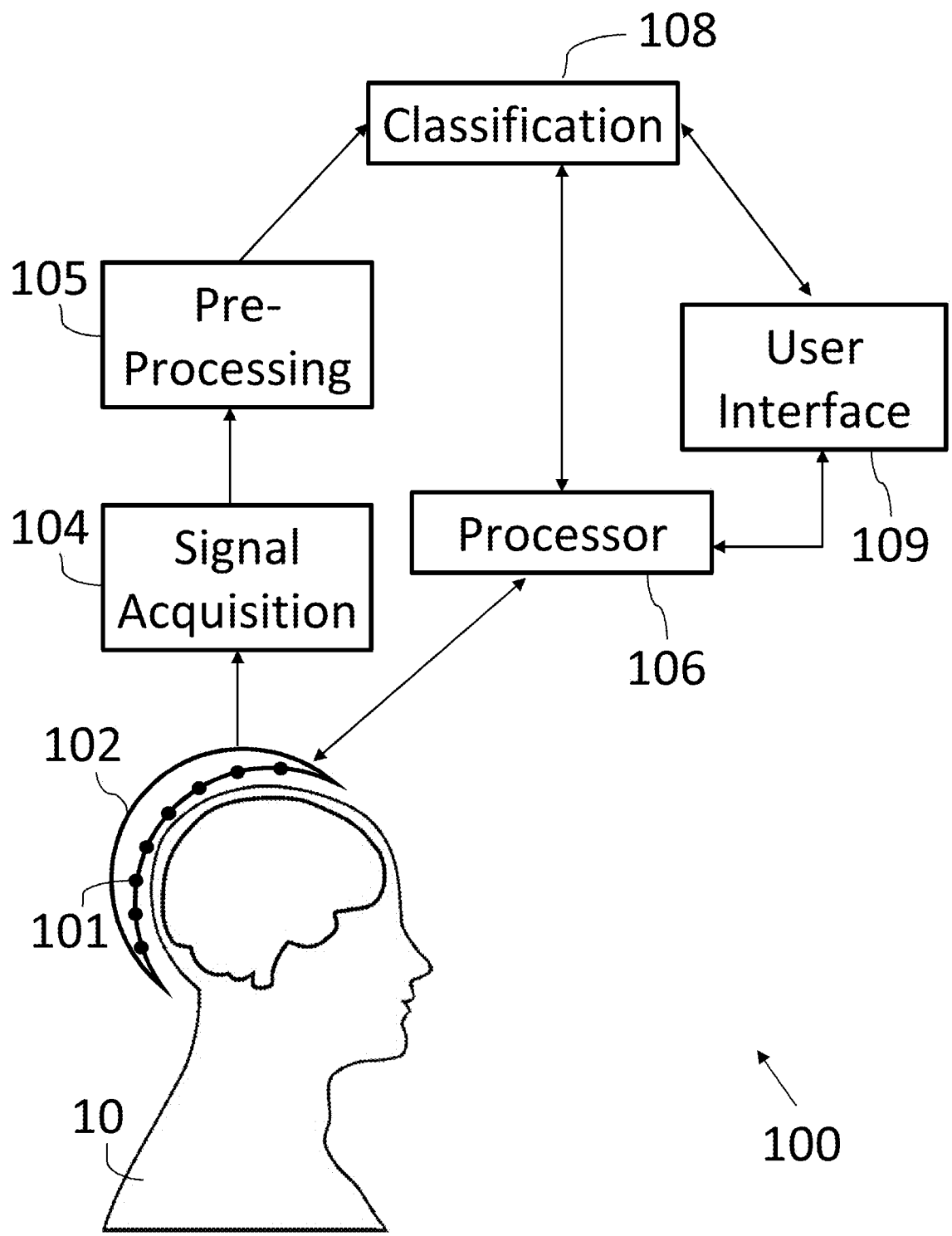
FIG. 1 schematically illustrates a brain-machine interface system, according to an exemplary embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Brain signals corresponding to physical movement of various body parts as well as imagined movement of large body parts have been thoroughly studied, whereby the imaginary movement of small body parts, and particularly brain signals corresponding to the imaginary movement of fingers, is particularly of interest for at least two main reasons. First, fingers are humans' instruments of finest control, which have the most dexterity/degrees of freedom/versatility. Therefore, it is intuitive that imagined movements of fingers similarly offer the widest control repertoire compared to all other possible BMI inputs under voluntary control. Second, fingers are humans' primary effectors for interacting with modem technologies. Electroencephalography (EEG) is an electrophysiological monitoring method to record electrical activity of the brain, and may therefore be utilized as a recording modality for brain-machine interfaces (BMIs). A brain-machine interface (BMI) is a direct communication pathway between the brain of a subject and an external computerized device. If a method for discriminating brain signals corresponding to imaginary movements is capable of providing a larger number of brain-states from a given set of brain signals, for instance signals associate with imaginary movement of a finger, then it may be possible to enhance the BMI since classification of the imaginary movements with higher resolution may be used for identification of larger number of brain-states thereby creating improved communication tools.

Using EEG, decoders have progressed from sensitivity to single finger movement onset without any specificity, to left vs. right hand discrimination, to distinguishing between movements by four fingers on the same hand and even pairs of fingers on the same hand with above-chance accuracy. It should be noted that, due to limitations of poor spatial resolution of EEG, the ability to discriminate between signals emitted by dense, overlapping neural representations of finger flexion has reduced the measurements to physical movements of larger body parts.

Reference is now made to FIG. 1, which schematically illustrates a brain-machine interface system, generally designated 100, wherein the direction of arrows indicates the direction of information flow, according to some embodiments of the invention. It should be noted that brain-machine interface system 100 is configured to provide a BMI with a subject 10, wherein system 100 may operate with any subject such that subject 10 is not part of brain-machine interface system 100. A wearable monitoring apparatus 102 may be fitted onto the head of a subject 10, wherein wearable monitoring apparatus 102 may comprise at least one sensor 101 that is configured to allow monitoring signals from the brain of subject 10. In some embodiments, a plurality of sensors 101 may be spatially distributed at wearable monitoring apparatus 102 in order to cover a greater area and thus allow enhanced measurement of brain signals originating from several sources in subject 10 skull.

According to some embodiments, plurality of sensors 101 may be positioned in proximity to subject 10, without the need for a wearable monitoring apparatus, whereby the brain signals from subject 10 are similarly recorded. In some embodiments, the recording of brain signals may be carried out without direct contact with the skin of subject 10.

In some embodiments, the measurement of the neural activity (i.e. of the brain signals) by at least one sensor 101 may be carried out using at least one of Electroencephalography (EEG), functional magnetic resonance imaging (fMRI), Electromyography (EMG), Electrooculography (EOG), Electrocorticography (ECoG), Magnetoencephalography (MEG), Near-infrared spectroscopy (NIRS), a platform sensor array, a multisite probe, a cone electrode, micro-wires, calcium imaging, "neural dust" sensors, or any combination thereof.

Brain signals that are measured by at least one sensor 101 may be recorded and transferred to a signal acquisition module 104. In some embodiments, the acquired signals may then be transferred to a pre-processing module 105 that is configured to initiate assessment of the measured data, for instance checking that received data is in appropriate format for brain signals. The pre-processing may also remove external electrical noise sources, and possibly other artifacts.

Some embodiments of the invention may include an article such as a computer or processor non-transitory readable medium, or a computer or processor non-transitory storage medium, such as for example a memory, a disk drive, or a USB flash memory, encoding, including or storing instructions, e.g., computer-executable instructions, which, when executed by a processor or controller, carry out methods disclosed herein. For example, an article may include a storage medium, computer-executable instructions, and also a controller. For example, pre-processing of the received data may be carried out by such a processor or controller.

Some embodiments may be provided in a computer program product that may include a non-transitory machine-readable medium, stored thereon instructions, which may be used to program a computer, controller, or other programmable devices, to perform methods as disclosed herein. Some embodiments of the invention may include an article such as a computer or processor non-transitory readable medium, or a computer or processor non-transitory storage medium, such as for example a memory, a disk drive, or a USB flash memory, encoding, including or storing instructions, e.g., computer-executable instructions, which when executed by a processor or controller, carry out methods disclosed herein. The storage medium may include, but is not limited to, any type of disk including, semiconductor devices such as read-only memories (ROMs) and/or random access memories (RAMs), flash memories, electrically erasable programmable read-only memories (EEPROMs) or any type of media suitable for storing electronic instructions, including programmable storage devices.

A system according to some embodiments of the invention may include components such as, but not limited to, a plurality of central processing units (CPU) or any other suitable multi-purpose or specific processors or controllers, a plurality of input units, a plurality of output units, a plurality of memory units, and a plurality of storage units. A system may additionally include other suitable hardware components and/or software components. In some embodiments, a system may include or may be, for example, a personal computer, a desktop computer, a laptop computer, a workstation, a server computer, a network device, or any other suitable computing device.

In some embodiments, the signals from wearable monitoring apparatus 102 may be processed by a central processor 106 and additionally by various modules that may be embedded at an external computerized device such that this device enables BMI with subject 10. The computerized device may comprise a Personal Computer (PC), a smartphone, a laptop or any other computerized device, or a combination thereof. In some embodiments, at least some of the measured data from the subject's brain may be stored at a dedicated memory module at the external computerized device (not shown in the figure).

After pre-processing, the data may be transferred to a dedicated classification module 108 where the brain signals may be translated using brain state classification. Brain states do not always have distinct effects on behavior, and most typically, behaviors emerge from a combination of brain states that operate together. Brain states appear, sustain and dissipate atop the background of brain activity, and can exist in the presence or absence of other brain-states. Meaningful analysis of brain signals is dependent upon brain-state of interest. Thus, activity that is deemed as valid signal in one context may in the next be deemed noise.

Classification of brain-states provides insight into the full range of brain function, and may readily be applied to medical technologies that improve quality of life. These technologies may be categorized within three areas: diagnostics, treatment monitors and communication tools.

In the area of diagnostics, brain-states may be used to identify the presence or absence of disease. For example, the presence of Alzheimer's disease. They also may be used to diagnose acute clinical events, such as seizure, or migraine.

In the area of treatment/therapy monitors, brain-states may be used to evaluate the efficacy of a drug or intervention. For example, they may be used to evaluate whether an anti-depressant is working. Brain-states may also inform interventions within a closed-loop, for example, informing titration levels of deep brain stimulating currents in Parkinson's patients. Longitudinal evaluation that insures safety, and personalization of interventions that insures effectiveness are amongst the most promising of brain-state monitoring based applications.

In the area of communication tools, these tools may be fashioned from brain-state classifying systems in order to provide assistive and augmentative abilities to individuals with severe motorial or other physical disabilities, such as amyotrophic lateral sclerosis (ALS) or cervical spinal cord damage. Communication may be in the form of using discrete brain-state signal to send discrete commands to a keyboard that enables words and sentences to be generated, or, in the form of linking brain-states to command repertoires for bionic limbs or external robotic systems. Moreover, communication may additionally be instigated between an individual and their environment, providing domotic (i.e., intelligent home environment) control with new degrees of independence.

Dedicated classification module 108 may comprise a multi-class support vector machine (SVM) classifier that may generate predictions and probabilities that serve as input into a new voting scheme, which may output a system decision corresponding to the classification of the brain states. In some embodiments, other learning algorithms or inference models may be utilized, such as linear regression, neural networks, perceptron, linear discriminant analysis, deep learning, auto-encoders, k-means clustering, or any combination thereof.

The classification may comprise multiple steps corresponding to physiological encoding of an imagined limb flexion, e.g., finger flexion, where these steps may comprise EEG data rearrangement, computation of covariance matrices in time and space, wavelet decomposition, and data reconstruction through a discrete filter bank, as further described hereinafter. In some embodiments, output from each step may be normalized to enable effective processing of the entire feature set within a uniform classification framework.

Some examples of brain states classifications may include: right thumb press, left thumb press, fatigued, attentive, asleep, awake, depressive, manic, learning, forgetting, fixated on target, distracted, seizure, deaf, Yes, No, any other 'discrete' classification, or any combination thereof.

From dedicated classification module 108, the translated command(s) may be transferred to a user interface 109 that may also be coupled to central processor 106. User interface 109 may display and/or execute the command received from classification module 108. For example, a brain signal from subject 10 imagining movement of a particular finger is received by sensor 101 and processed by classification module 108 that identifies the imagined movement with the command to turn on light. It should be noted that imagining movement of a finger in one context, for example, when done in, or with respect to the kitchen, can mean one command, i.e., 'turn on light'. While, in another context, for example, in the living room, imagining movement of that same finger can mean 'turn the volume up'.

In some embodiments, subject 10 may perform a predefined calibration process where particular imagined movements are linked with corresponding commands. For instance, subject 10 may link imagined movement of right thumb with turning off the lights in the room. It is appreciated that the imagined movement may be redefined over time, wherein the same imagined movement may be linked to a different command.

Some examples of translated commands corresponding to the computed classification may include: move cursor left, press 'right button', alert physician, send text message, select song, turn on light, open door, accelerate wheelchair straight, any other command, or any combination thereof.

In some embodiments, the processing of the command may include machine learning algorithms (and possibly neural networks, or any other similar method) that are configured to improve the classification of the brain states corresponding to the received data. Thus, such machine learning algorithms may allow prediction of brain states based on previous recordings. In some embodiments, by analyzing the response of brain signals to feedback from the BMI system it may be possible to detect errors in the classification.

In some embodiments, the learning loop created with the feedback from the BMI system may be improved by monitoring brain activity, classifying it, and issuing commands, whereby over time the algorithm may anticipate actions based on contextual cues (e.g., time of day, location, etc.) in combination with brain-state, or previous recorded chains of brain states.

It is appreciated that, by inferring brain states for individual subjects based on contextual computing (and other elements of previous computing), there is no need to rely on predefined brain states in order to allow prediction and classification of brain states for a particular patient. With discovery of personal brain states, as well as the personalization of the BMI system to the individual user over time, an improved interface may be created.

Furthermore, in some embodiments it may be possible to detect errors in the classification and system output while correcting the output in real-time such that there is no need to send additional commands by the user. In some embodiments, upon detection of an error, the BMI system may initiate "self-correction" and recalibration algorithms in order to avoid future errors in similar contexts, as well as in the presence of similar inputs.

Figure 3A:
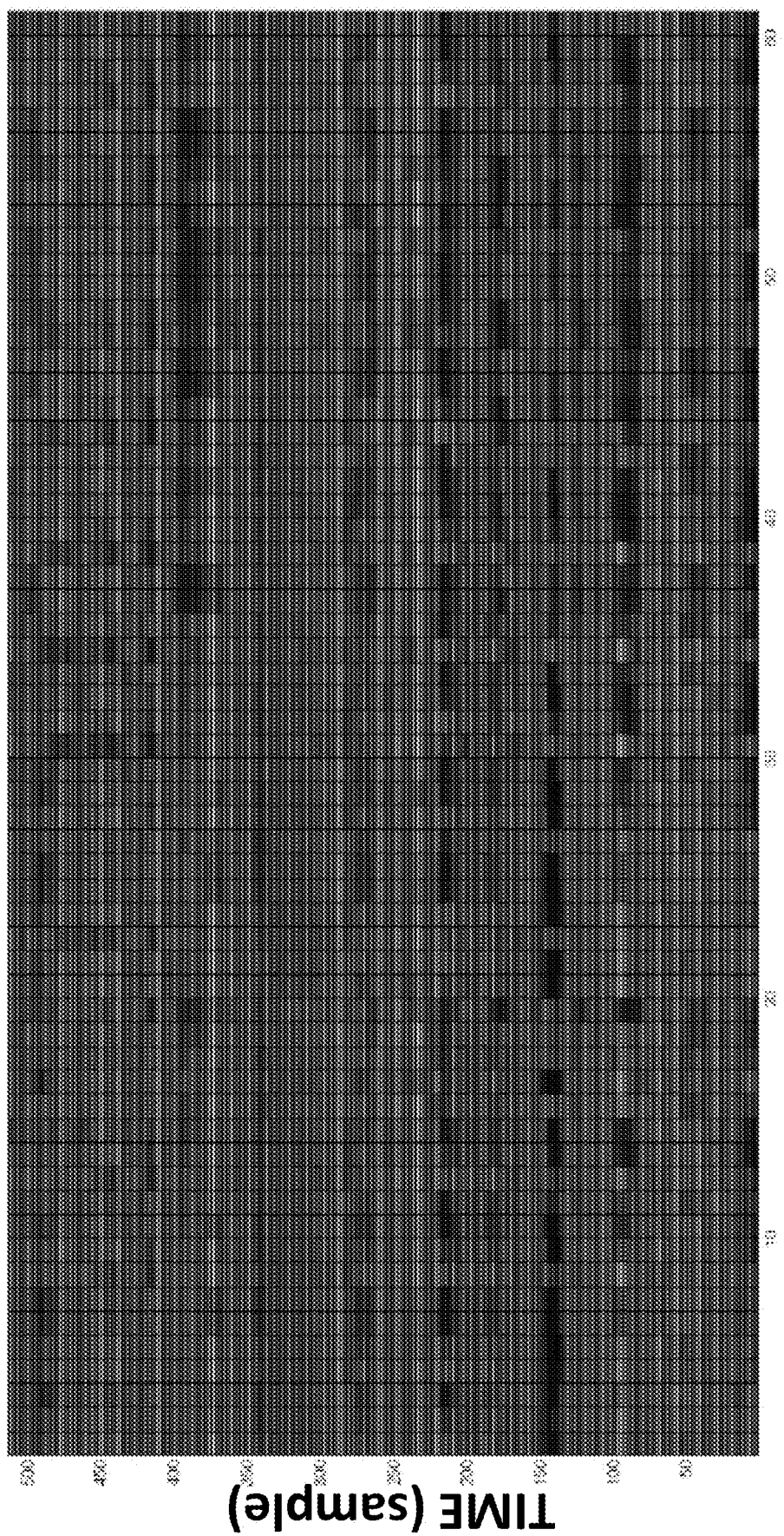
FIG. 3A shows a montage of EEG data before sequencing, according to an exemplary embodiment of the invention.

The received raw data from the measurement by the sensors (e.g., EEG measurements) may be distributed across a sample space in order to achieve enhanced smoothness of the signals. It should be noted that channel-wise correlations, for instance as shown in FIG. 3A, are highest at nearest neighbor positions, wherein the arbitrary ordering of data, or data structure that does not comply with a predefined structure (as commonly provided for devices of such measurements), due to the large number of brain signals and sensor positioning, as acquired by the monitoring system has typically low smoothness. Therefore, a new arrangement of sequence of recorded data may be devised with grouping of brain states, according to a heuristically approximated, shortest-path Hamiltonian solution.

Neurophysiologists have long known that functionally informative activity is topographically clustered, with each cluster being a component of larger functional structures. From this principle a method of data processing is provided that maximized smoothness across the sample space and exploited channel-wise correlations being highest at nearest neighbor positions to impose a novel structure on the dataset that would make it more discriminative at higher-orders of analysis.

According to some embodiments, such BMI system may allow training a user for predetermined activities, for example recording brain signals when the user is asked to press number and/or characters keys, each time with different fingers. Thus, the recorded (training or calibration) data may allow identification if a user that punched a sequence of keys being a pass-sequence, is the user for whom that sequence was assigned as his/her password. This may be done by comparing a received sequence of brain signal, which was received during the operation of punching the pass-sequence, to a pre-achieved database of recorded signals for the predetermined sequence. It was found by the inventors, that the "finger prints" of the brain signals associated with the sequence of actions involved in a defined sequence of finger (and/or thumb) movements, for example when finger(s) are operated to select characters/numbers as an input, is unique enough to differentiate brain signals of a person punching his own pass-sequence from that of another person punching the same sequence.

Figure 2A:
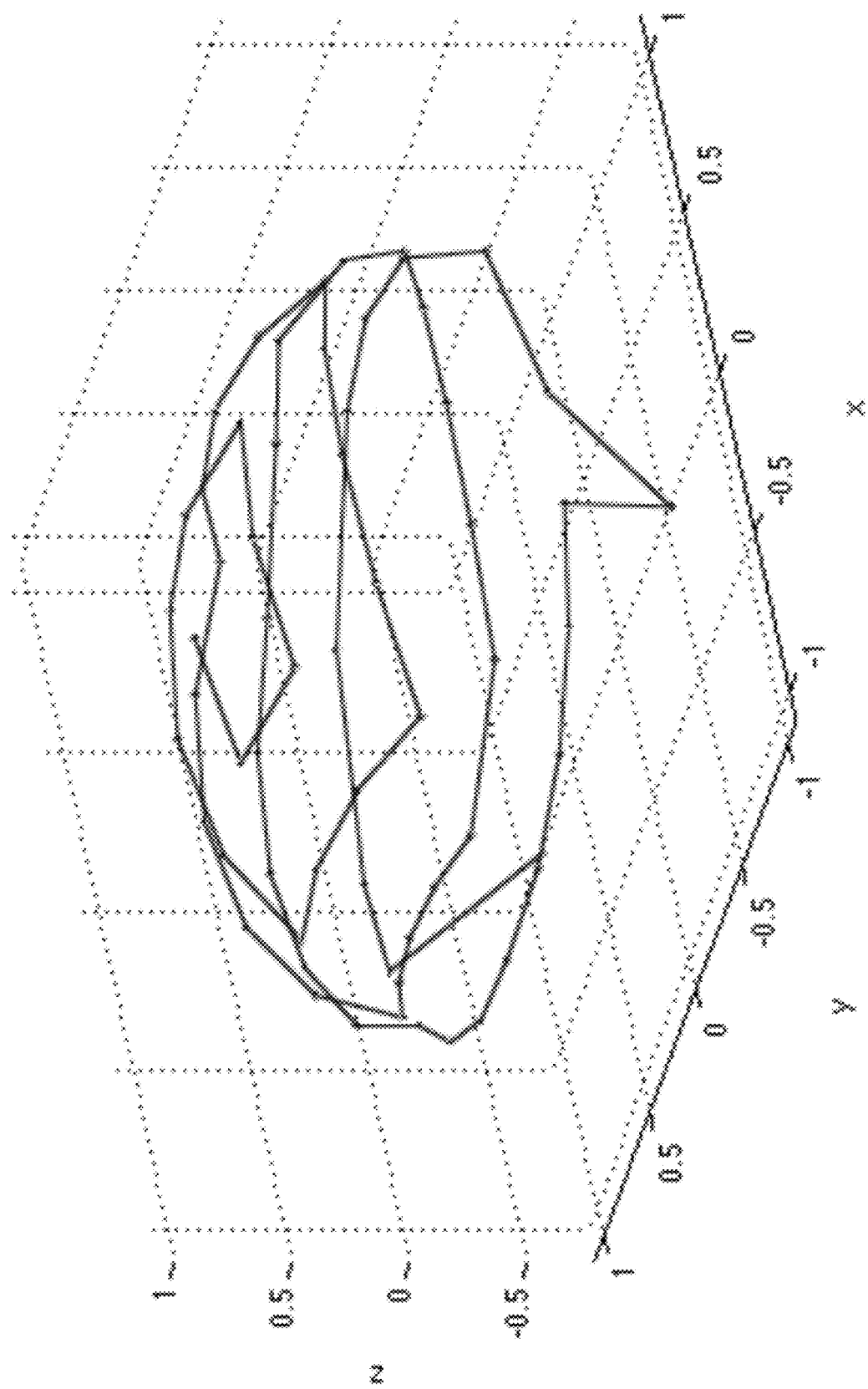
FIG. 2A shows a spiral cluster representing signals from the monitoring sensors, according to an exemplary embodiment of the invention.
Figure 2B:
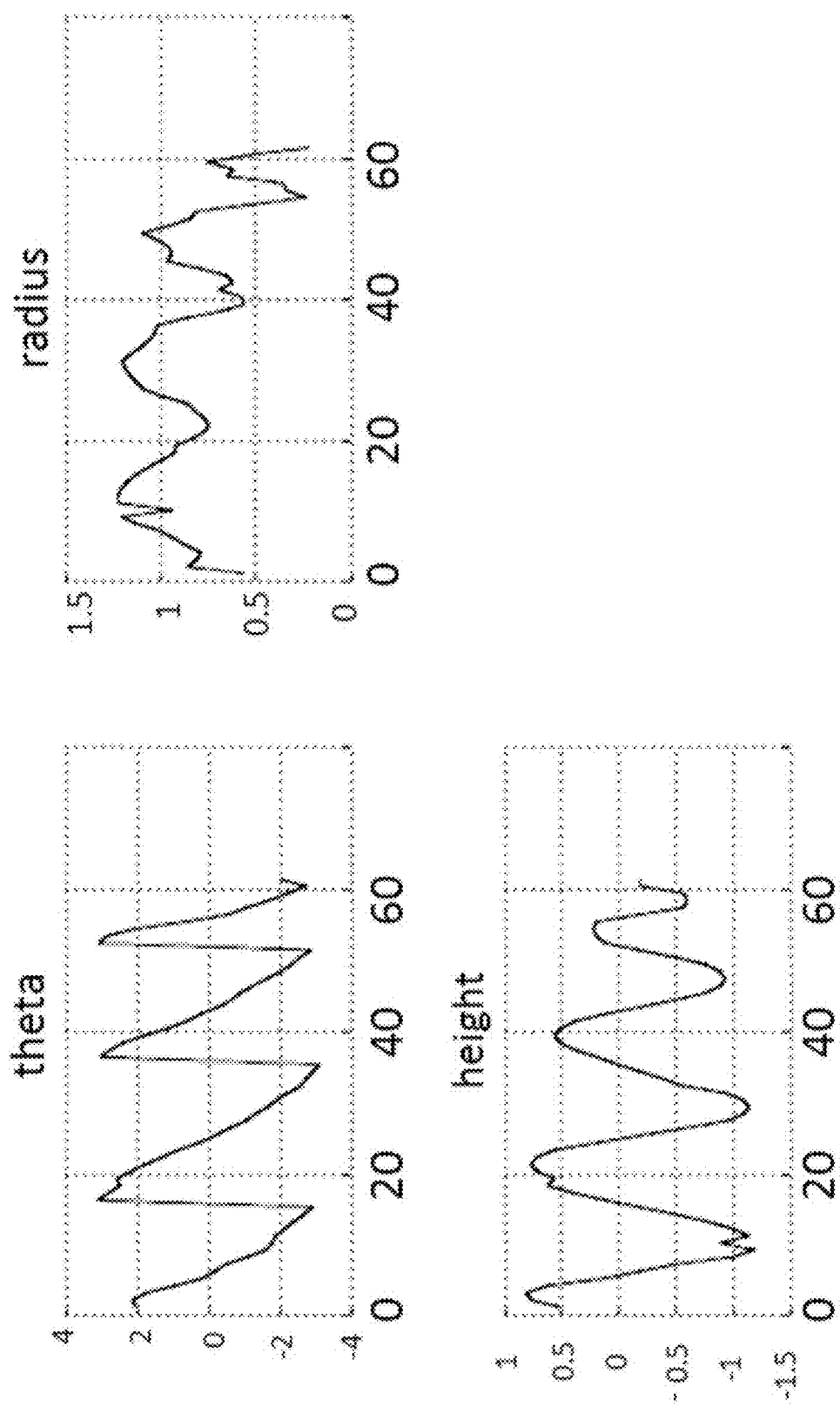
FIG. 2B shows cylindrical polar components of the spiral cluster, according to an exemplary embodiment of the invention.
Figure 2C:
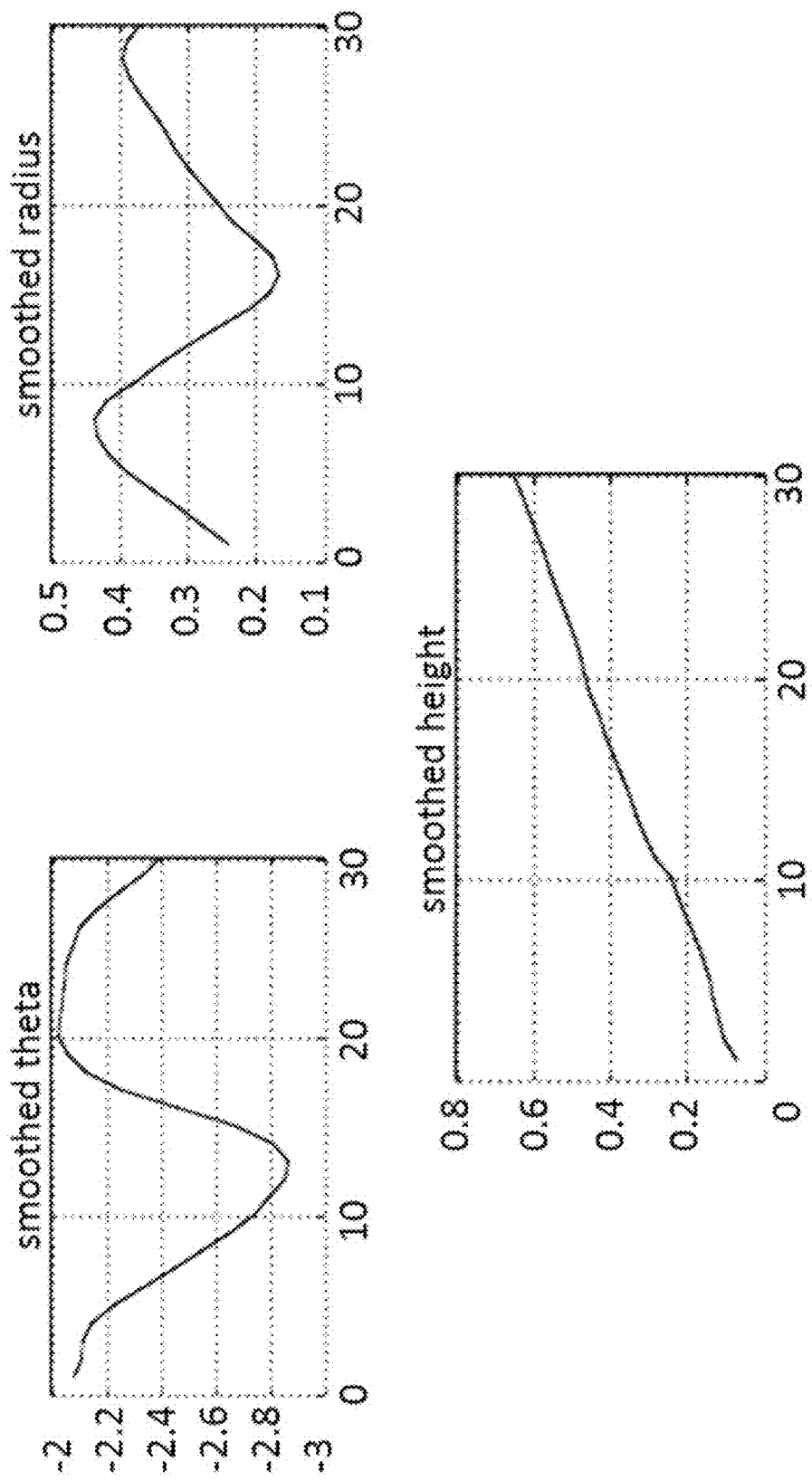
FIG. 2C shows the smooth cylindrical polar components from FIG. 2B after optimization, according to an exemplary embodiment of the invention.

Reference is now made to FIGS. 2A-2C, which show a spatial montage created from the received signals, according to some embodiments of the invention. FIG. 2A shows a spiral cluster representing signals from deployment of the monitoring sensors topography according to a spiral arrangement around the skull. FIG. 2B shows graphs of spatial cylindrical polar components of the spiral cluster, and FIG. 2C shows the smooth spatial cylindrical polar components from FIG. 2B after optimization. It should be noted that these figures show data sample for a 61 channel EEG wearable monitoring apparatus 102, whereby similar data grouping may be applied for any different number of sensors (e.g. above three sensors).

For example, discussion of the use of a sensor arrangement with several mastoid electrodes. The start position of the spiral cluster may be defined at one of the mastoid electrodes, being one of the two most peripheral relative to the remainder of the montage's spatial clusters (and to neighbor electrode). Next, a systematic spiral around the caudal-most section of the transverse plane of the cluster may be defined to create the spiral representation. Once every point (corresponding to an electrode) in the first level had been passed, the spiral may be elevated step-wise to the nearest electrode of the next level closer to the vertex. Resulting in a spiral montage that greatly improves data smoothness, as may be appreciated by FIG. 2C.

Figure 3B:
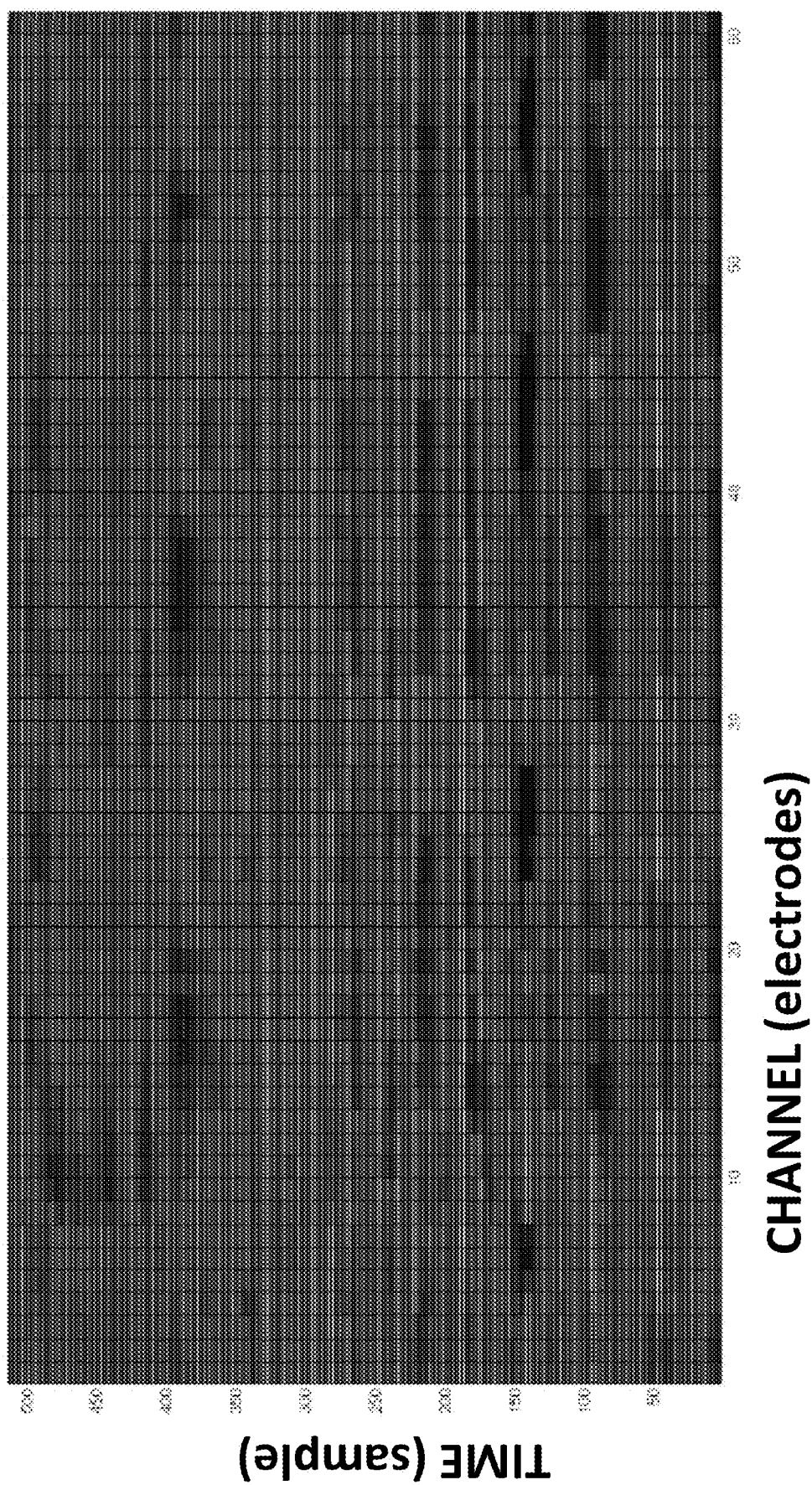
FIG. 3B shows a montage of EEG data after sequencing, according to an exemplary embodiment of the invention.

Reference is now made to FIGS. 3A-3B, which show a montage of EEG data before and after sequencing respectively, according to some embodiments of the invention. It should be noted that, in these figures, the Y axis is time and the X axis is electrodes. The graphs in these drawings represent data for 512 samples from 61 channel monitoring device for one second of data, wherein the shade intensity indicates the voltage amplitude. Prior to feature extraction and classification, data from all epochs may be rearranged according to the spiral montage (as shown in FIGS. 2A-2C). Thus, a standard montage of EEG data (as shown in FIG. 3A) may be rearranged as the "smooth" montage of EEG data (as shown in FIG. 3B), wherein the data may be rearranged with modification (or normalization) carried out in order to create the "smooth" curves in the previous steps, i.e., as described in FIGS. 2A-2C. It is appreciated that after rearrangement in the order of recorded data corresponding to position of the sensors, the channels of the montage are grouped according to the classification so that true signals (signals representing brain state) may be easily distinguished from noise.

Figure 3C:
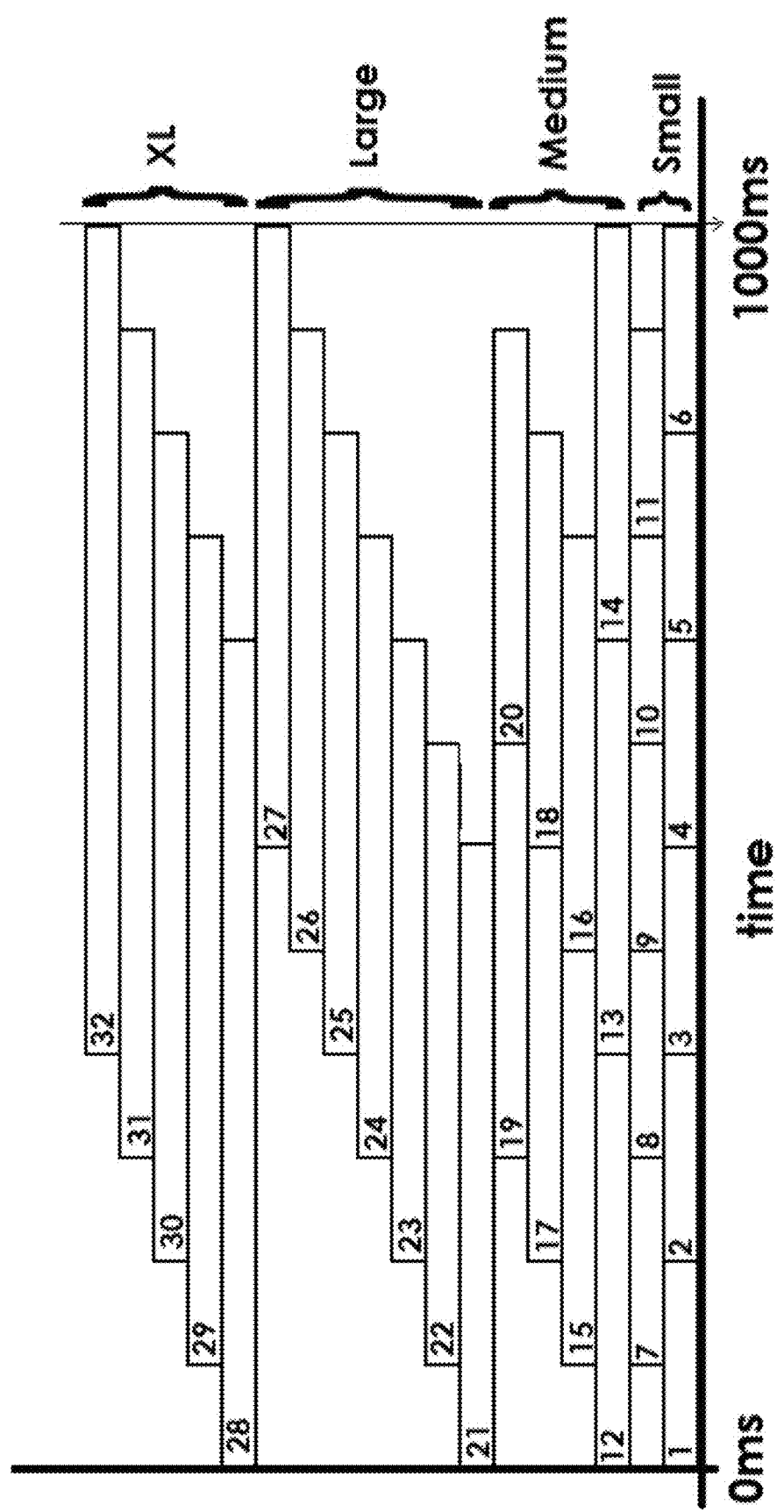
FIG. 3C shows a windowing filter, according to an exemplary embodiment of the invention.

Reference is now made to FIG. 3C, which shows a windowing filter, according to some embodiments of the invention. Latencies of temporal sequences of brain signal data are information bearing and variable between individuals, such that a dedicated two-part adaptive segmentation scheme may be adapted. The first part (the second part is further described hereinafter) entails methodically windowing the data, for instance at symmetrically overlapping 80 sample (154.3 ms) windows, with the sequence repeating at larger factors (up to 400 samples, 779.3 ms), to the extent that 32 unique windows are extracted for each second of data. Once window sizes are defined it may be possible to symmetrically overlap the windows in order to get maximum information most efficiently.

Figure 4A:
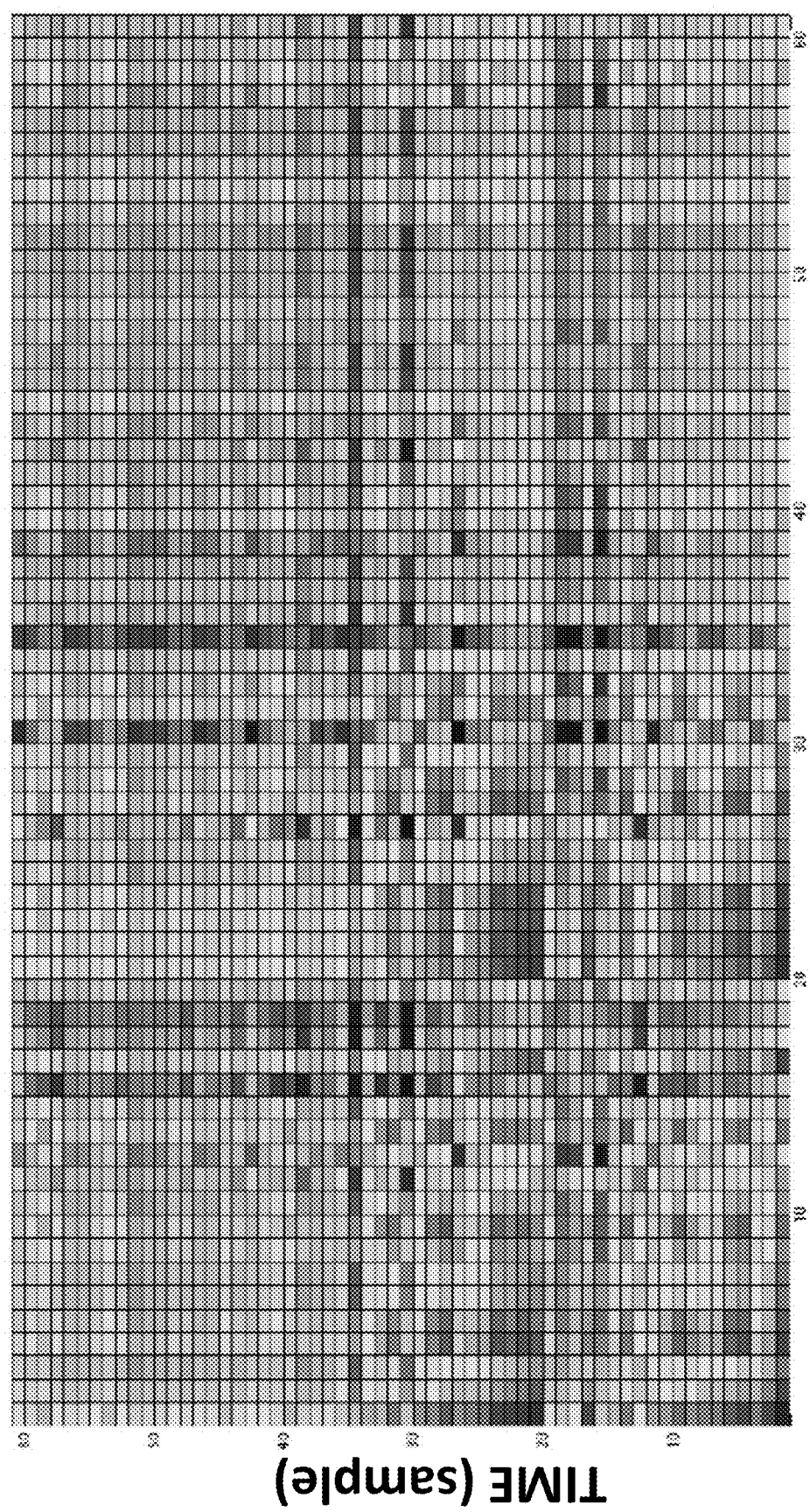
FIG. 4A shows temporal covariance of the montage, according to an exemplary embodiment of the invention.
Figure 4B:
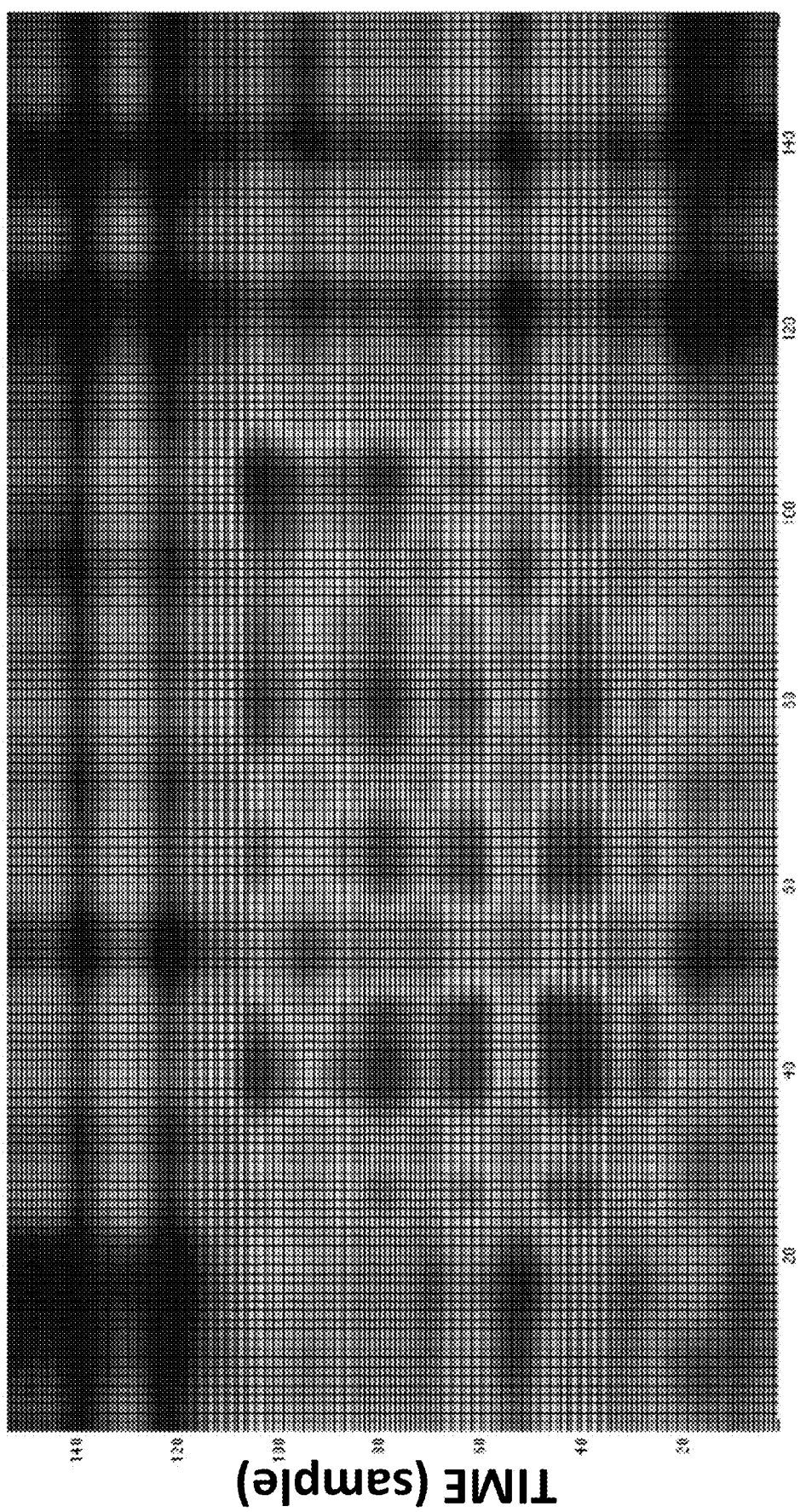
FIG. 4B shows spatial covariance of the montage, according to an exemplary embodiment of the invention.

Reference is now made to FIGS. 4A-4B, which show temporal and spatial covariance of the montage respectively, according to some embodiments of the invention.

Both the temporal covariance matrix and the spatial covariance matrix may be computed through the empirical estimator:

$$\text{Cov} = \frac{X^T X}{N-1}, \tag{1}$$

where '$X=X_{ti}$' when computing covariance in time, where $X_{ti} \in R^{N \times C}$, and '$X=X_{sp}$' when computing covariance in space, where $X_{sp} \in R^{N \times C}$. X corresponds to a single trial of data, where N is samples and C is channels.

It should be noted that both the temporal and the spatial covariance may provide additional information for classification of the signal corresponding to each window from the previous steps, since it may provide indication of a particular command, as further described hereinafter.

Figure 5A:
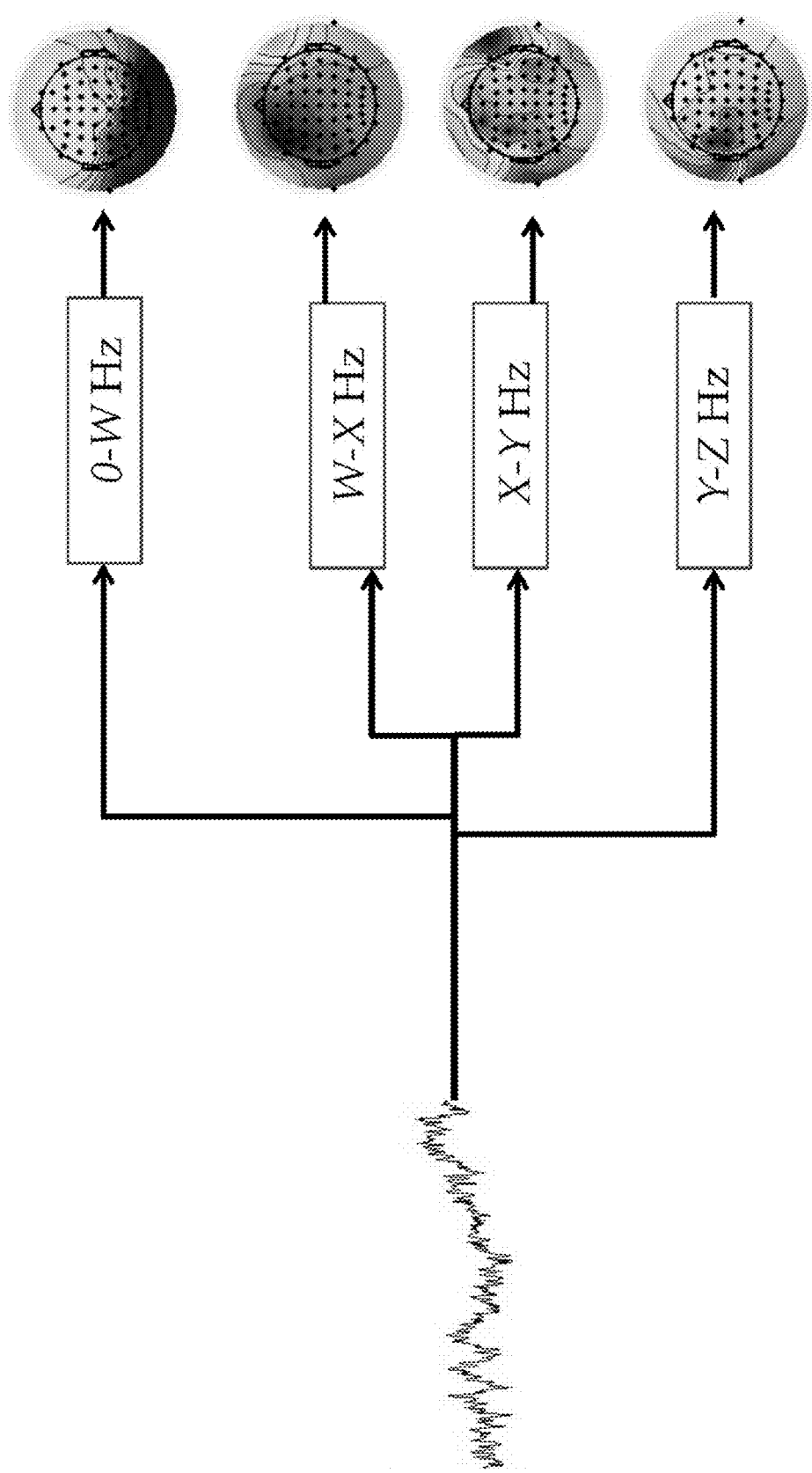
FIG. 5A shows a first representation of a wavelet filter feature bank of the montage, according to an exemplary embodiment of the invention.
Figure 5B:
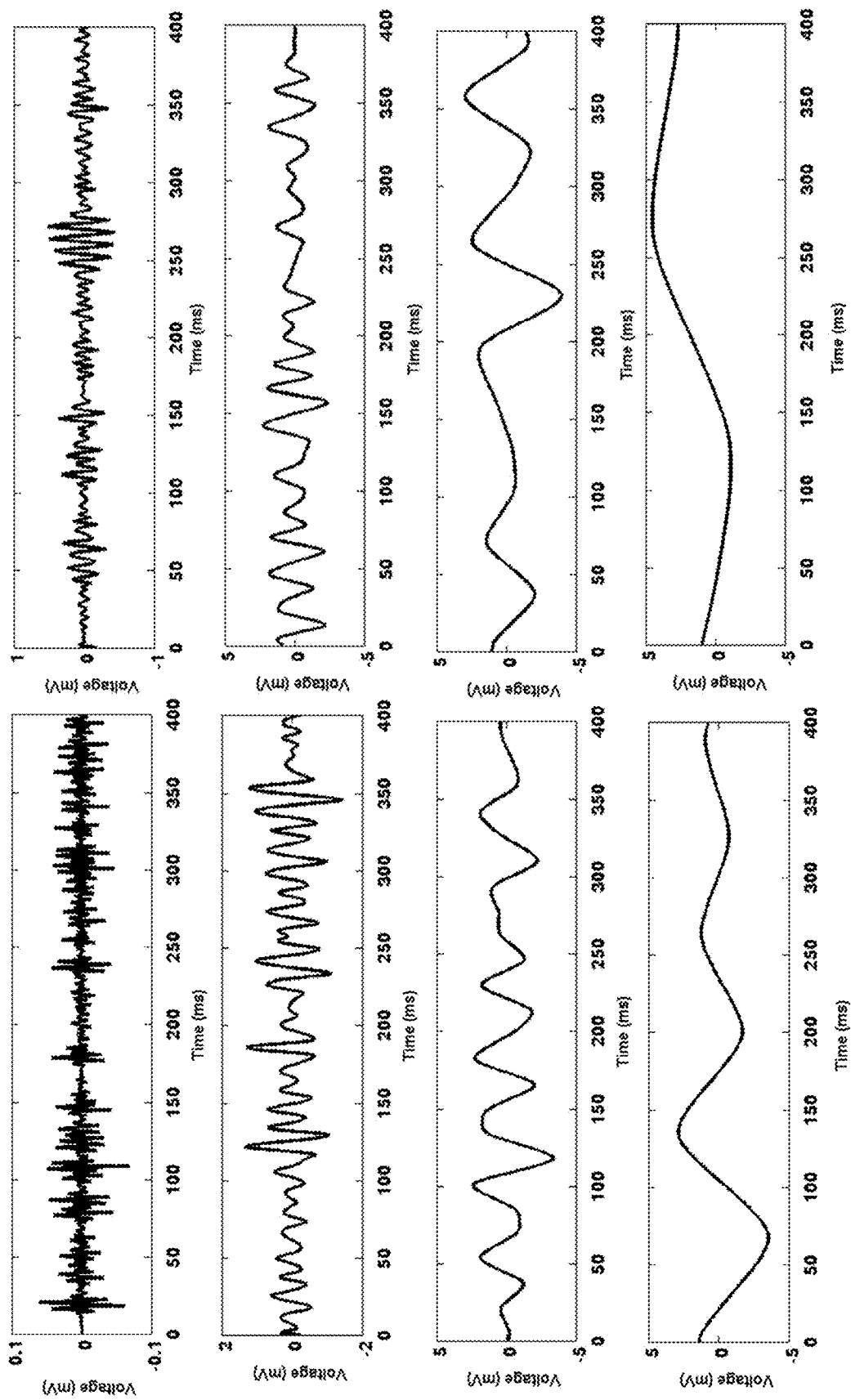
FIG. 5B shows a second representation of a wavelet filter feature bank of the montage, according to an exemplary embodiment of the invention.

Reference is now made to FIGS. 5A-5B, which show first and second representations of a wavelet filter feature bank of the montage, according to some embodiments of the invention. Electrophysiological data are highly non-stationary, and fast, transient events are often of great significance, and while apriori knowledge in the field imposes certain constraints as to the types of frequency-domain activity that might be relevant to a given brain-state, there remains uncertainty about relevant activity.

The wavelet transform may be performed, being a convolution of the signal, x(t), with an elementary function, $\psi_{s,\tau}$(t). Formally defined as the following inner product:

$$W_\psi X(s,\tau) = \langle x(t) | \psi_{s,\tau}(t) \rangle, \tag{2}$$

Where $\psi_{s,\tau}$(t) are scaled and translated versions of the mother wavelet function $\psi$(t), where:

$$\psi(s,\tau) = \frac{1}{|\sqrt{s}|} \psi\left(\frac{t-\tau}{s}\right), \tag{3}$$

such that s and $\tau$ respectively represent the scaling and translation parameters, defining how the mother wavelet is scaled (i.e. contracted and dilated) and translated (i.e. shifted incrementally) in the convolution with the recorded brain signals. Scales and translations where defined discretely as the set:

$$\{s=2^{-j}, \tau=2^{-j}k\} \text{ with parameters } j,k \in Z, \tag{4}$$

A multilevel, one-dimensional wavelet decomposition may be computed with j initialized to seven, and the wavelet function (ψ) defined as a biorthogonal wavelet with decomposition and reconstruction filters of five. Data was then reconstructed through eight discrete frequency banks (seven details and the approximation), such that each frequency bank is comprised of the data reconstructed from a single details level, with one bank further containing the reconstructed signal from the approximation.

It should be noted that, in selecting the specific mother-wavelet that most efficiently captured frequency information intrinsic to the signal of interest, and in separating frequency activity into neurophysiologically-relevant frequency banks, a significant improvement may be provided. In some embodiments, feature reduction can be introduced at this filter bank stage if desired, for example by modeling the signal in each reconstructed frequency bank as $s(n)=f(n)+\sigma e(n)$, where n is the number of samples, and $e(n)$ a Gaussian colored noise component, scaled by σ, the standard deviation of the noise. The overall objective is to dampen the noisy components and recover f, which can be done effectively by setting a threshold rule beyond which the data is defined as noise. Soft thresholding by the universal threshold $\sigma\sqrt{\log(N)}$ would be one preferred way of doing so, Alternatively, it may be done by computing the information entropy in each frequency bank and discarding those banks with entropy beyond a given threshold. A third way is to decompose the data using principal component analysis, retain only a portion of the top components (for example, the first 4 principal components) and discard the remainder. It should be noted that other methods for feature reduction may also be employed.

Next, each category of extracted features may be normalized independently according to a common procedure, beginning with calculation of the feature's z-score through:

$$Z_{ft}=(Y-\mu)/\sigma, \quad (5)$$

where Y is the unrolled feature, μ is the feature's population mean, and σ the feature's standard deviation. The normalized feature vector is then computed by $$\hat{Y}=\frac{Z_{ft}}{\max|Z_{ft}|}, \quad (6)$$

After normalization, all feature vectors are concatenated, and labeled vectors may be filed into a feature matrix per subject. It should be noted that matrices may be transformed into single row vectors, whereby a corresponding single column vector may contain the labels.

It should be noted that such normalization is a desired practice for machine-learning procedures that may be useful in aggregation of data and improvement of the classification algorithm.

A one-versus-one multiclass Support Vector Machine (SVM) with a linear kernel may be employed using a standard commercially available software package, applied to a six-class task. As the dataset contained six classes, a total of fifteen binary classifiers, each trained to distinguish between a pair of classes, may be constructed. The Max-Wins decision rule determined the system's output, whereby each new sample may be classified by every binary classifier, and the class that received the highest number of votes may be selected. In case of ties, an arbitrary assignment may be made to the class with the lowest index. It should be noted that the SVM is described with an exemplary number of classes, and classification tasks with different numbers of target classes may necessitate different numbers of classifiers.

For every subject, feature matrices may be processed through a ten-fold cross-validation procedure. Validation folds may be generated through random sampling, using time information to seed the random number generator. To train and test the primary-level SVMs, at each fold about ~80% of the data may be used for training, about ~10% for tuning the hyperparameter C, and the remaining ~10% may be used as an unseen test set. Fold indices, once generated for cross-validation testing of features corresponding to the first window, may be kept constant for the remaining thirty-one windows. In some embodiments, posterior probability estimates may also be computed, by mapping distance-from-hyperplane values to prediction accuracies through the training of a secondary-level sigmoid function.

Figure 6A:
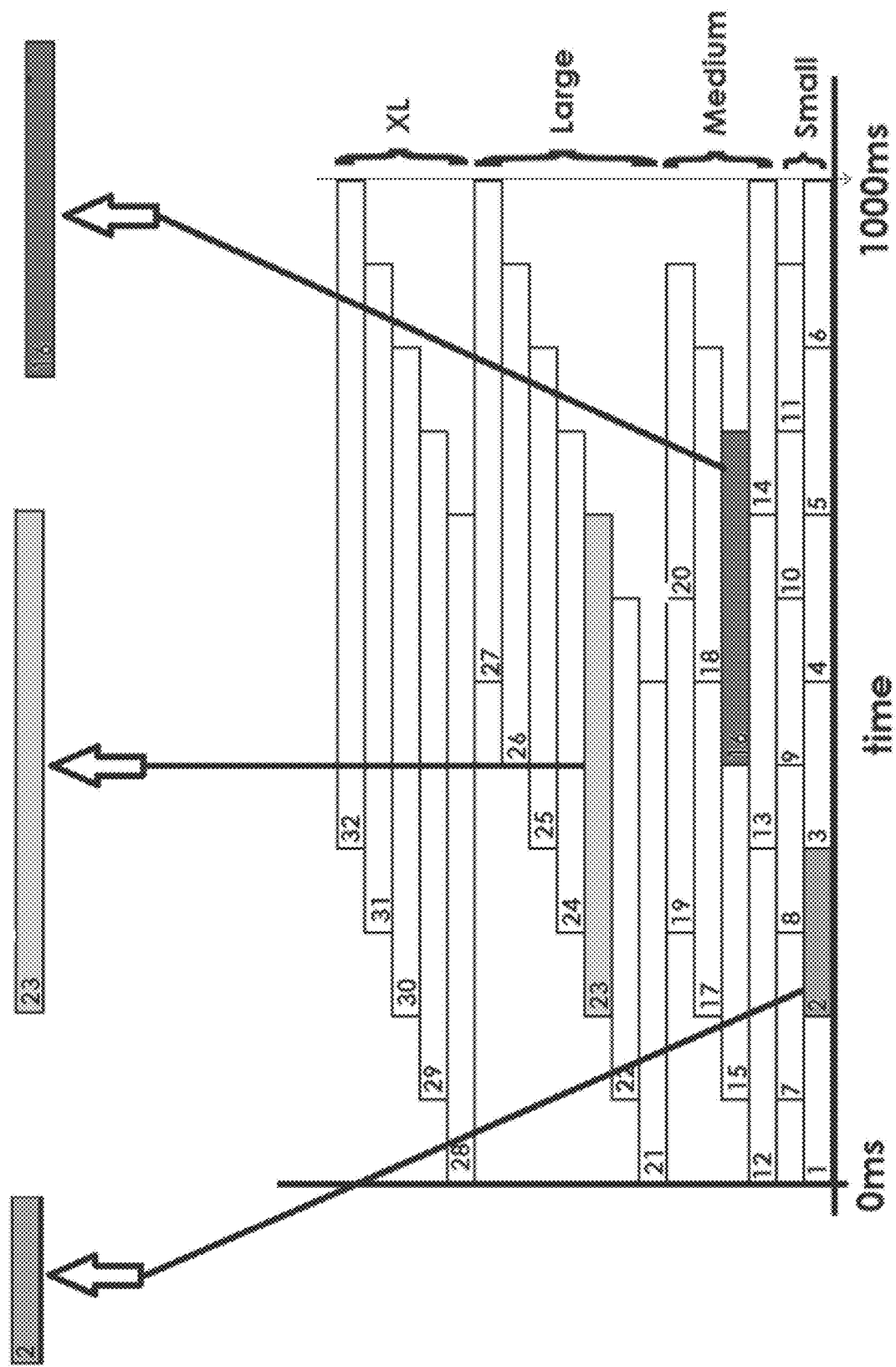
FIG. 6A shows window selection, according to an exemplary embodiment of the invention.
Figure 6B:
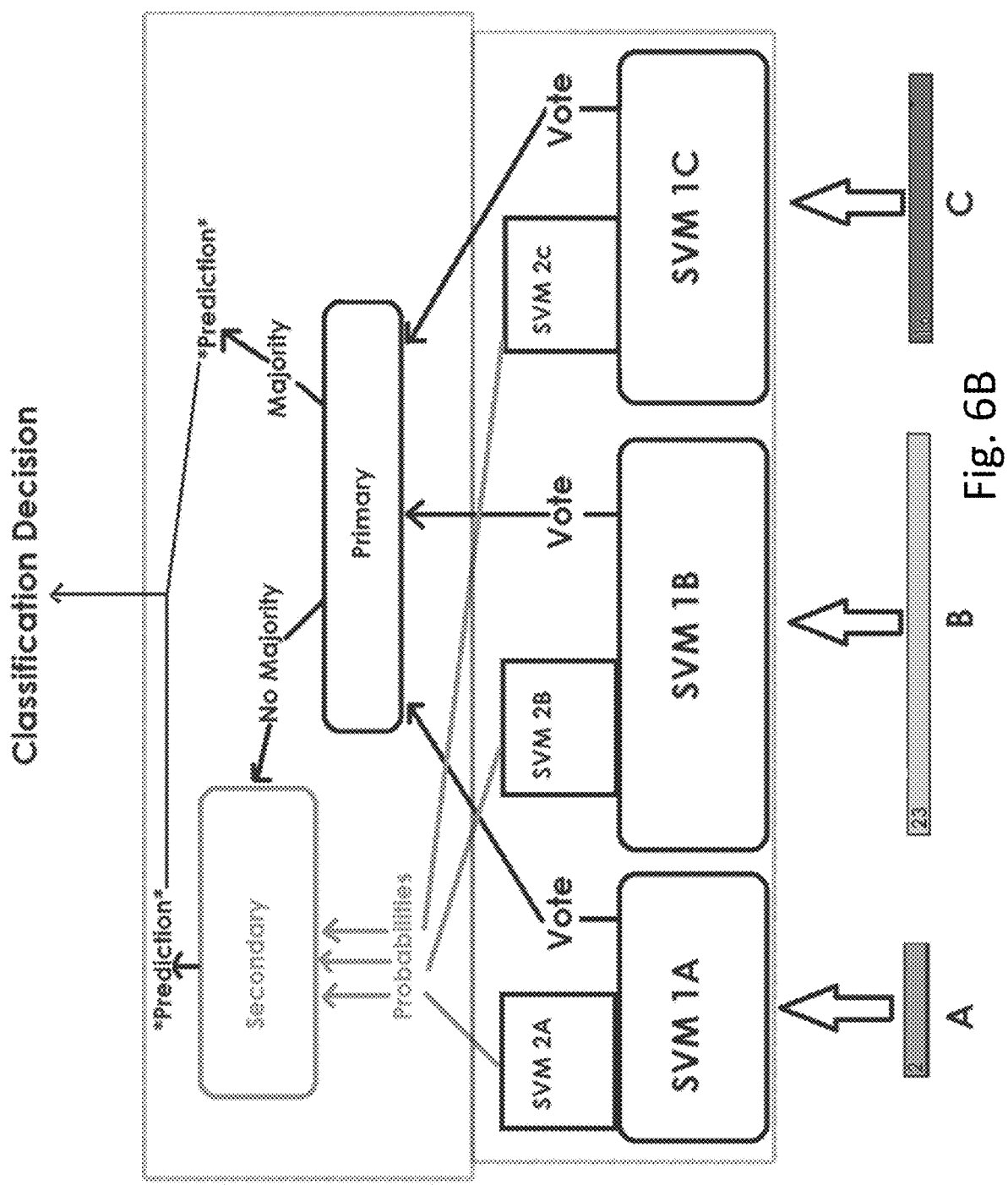
FIG. 6B shows window selection, according to an exemplary embodiment of the invention.

Reference is now made to FIGS. 6A-6B, which show window selection, according to some embodiments of the invention. FIG. 6A shows selection of three windows yielding highest cross-validated classification accuracies in tuning phase, and FIG. 6B shows a 'voting' process for the selected three windows. At this step, support-vector machines may be trained on the feature sets generated for each window.

A persistent challenge to BMI technology is adapting to inter-subject variability. One technique for doing so is the selection of personalized time windows for feature extraction that isolate the most discriminative information per subject. Thus, personalized window selection may be automated, with the three windows corresponding to the highest accuracies during hyperparameter tuning chosen as inputs for the voting scheme.

During testing, the three selected windows' classifiers output their predictions along with posterior probability estimates into a decision function that made the final classification according to the rule, $$D = \begin{cases} \mathcal{P}, & \text{if } 1A_v = 1B_v = \mathcal{P} \\ \diamond, & \text{if } 1A_v = 1C_v = \diamond \\ \ell, & \text{if } 1B_v = 1C_v = \ell \\ \aleph, & \text{if } 1A_v = 1B_v = 1C_v = \aleph \\ \xi, & \text{if } 1A_v \neq 1B_v \neq 1C_v = \xi \end{cases}, \quad (7)$$

where $1A_v, 1B_v, 1C_v$ are the predictions (i.e. votes) of the first level SVM classifiers for windows A, B, and C respectively; and, are the labels predicted. Thus, if at least two classifiers agree, their prediction became the system's decision D. In the case that all first level classifiers disagree, the decision signals the system to evaluate probability estimates from the secondary-level sigmoid function. If the first level classifiers disagree, the evaluation may be pushed up one level, where probabilities, that were computed by sigmoid functions and previously trained on outputs from each first level classifier, are assessed and then determine the decision. Canvassing of the secondary level information is crude, with a strict winner-take-all rule presiding:

$$D = \begin{cases} \mathcal{P}, & \text{if } 2A_p > 2B_p \ \& \ 2C_p \text{ and } 1A_v = \mathcal{P} \\ \diamond, & \text{if } 2B_p > 2A_p \ \& \ 2C_p \text{ and } 1B_v = \diamond \\ \ell, & \text{if } 2C_p > 2A_p \ \& \ 2B_p \text{ and } 1C_v = \ell \end{cases}, \quad (8)$$

where $2A_p, 2B_p, 2C_p$ are the second-order probabilities associated with the first-level predictions for window A, B, and C respectively; and the labels predicted at the first level. The empirical guessing level was estimated by random permutation of labels during testing.

Finally, a complete method is provided that generates personalized definitions of brain-states, which afterwards may be identified in new contexts, and continuously evaluated.

It is appreciated that the following method steps may provide particular improvement in such classification of brain states (alone and also in combination):

A) The sequencing of data channels according to the optimization objective.

B) The inclusion of temporal covariance.

C) Normalization of each feature individually before concatenating into the feature vector.

D) The selection of windows through an automatic cross-validation evaluation procedure.

E) The design of the wavelet filter bank: with choice of mother wavelet for decomposition and reconstruction, and the discrete banks selected for use.

F) The voting scheme that uses predictions at a primary level, and probabilities at a secondary level.

In some embodiments, while the abovementioned system was described with EEG data, these methods may also be used on other electromagnetic measures, ranging from patch recordings (intracellular current measurements of a single cell), single-unit recording, multi-unit recording, to local field potentials (Electro "x" graphies, where x=body part measured).

It is appreciated that one of the advantages of the abovementioned method is the accuracy it achieves in classifying brain states. This accuracy endows it with increased utility over the conventional manners of solving the problem. This method furthermore is expected to be more robust, and reliable in real-world applications, as it is designed to extract invariant features of the signal rather than exploit temporary features that are dependent upon a specific time, setup, and subject.

In some embodiments, any measurement of ionic current flow through biological tissue may be subjected to this method, whereby it is also conceivable that the methods and system described above may also offer utility to the analysis of current flows in other contexts, such as solar winds, polar auroras, radio waves, batteries, semiconductors, etc. Other methods of prioritizing and filtering some field signals over others in purpose of extracting certain data may also be utilized.

In some embodiments, such classification system may assist in creation of a brain-machine interface that enables individuals to control devices such as smart phone or computer and operate applications in them by imagining finger movements and by translating the brain signals correlating to these movements into machine commands. Furthermore, these methods may be applied to differentiate between any brain states that the methods are trained to differentiate between, for example, diseased or non-diseased, attentive or distracted. These states may be classified with high accuracy, and where necessary, in real time. Application of the method to classify brain states may find rapid utility in the medical industry, military industry, and consumer electronics.

For example, some non-medical utilizations of the classification method:

Gaming—control of characters through voluntarily initiated motor-states (turn right, jump, etc.), or passively through reactions to events (surprise, fear, excitement) or longitudinal emotional states (engaged, fatigued, etc.).

Transportation—monitoring states of drivers (for example, private, public transit, shipping, commercial pilots) for safety. Faster control over vehicle (expedited braking), voluntary modification of environment (manipulate radio controls, open windows), and initiation of autopilot if conditions warrant.

Military—communication in environments where silent communication is essential. Control of systems while otherwise occupied. More efficient processing of visual images expediting anomaly detection, and other information processing enhancement applications. Lie detection, and familiarity indexing.

Research—Brain state tracking in context of experimental manipulations. Especially relevant for psychology, cognitive science, neuroscience, psychophysics, computational psychiatry. Enables naturalistic studies as signal may be acquired remotely.

Marketing—Analysis of consumer reactions to branding campaigns, advertisement, packaging, products, and entertainment content (e.g. movies, music, TV).

It is appreciated that the described BMI system does not use generic measures to define states, but rather, it takes as a fundamental premise the immense diversity in human brains, and defines and classifies states for individuals thereby providing a personalized solution. The BMI system may define brain states in the absence of apriori predetermined knowledge, it may define extemporaneously (i.e., "on the fly") based on evolving data, whereby the BMI system also has an intelligent self-corrective mechanism triggered by brain-states reflecting a system 'error'. Furthermore, the BMI system is co-adaptive and improves over time as the user learns the system while the system also learns the user at an accelerated rate, since it is able to track the user's learning (based on classification of learning-related brain states). It should be noted that the structure of the abovementioned BMI method provides for multimodal signal fusion and classification, whereby brain activity measurements are processed in combination with labels, which may be numerous, wherein these labels may be other physiological or non-physiological measures or categories, and states may be both defined and classified based on this rich mixture of data.

It is appreciated that while BMI systems were described above, any other type of interface may be modified in a similar way in order to provide a similar solution. Furthermore, while a finger movement was described above, any other body part may be similarly studied in order to detect the imagined movement. Furthermore, less motorial (i.e. more abstract or sensory) imagined actions may conceivably be classified. For example, imagining a color, or a word, or a tone.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

Various embodiments have been presented. Each of these embodiments may of course include features from other embodiments presented, and embodiments not specifically described may include various features described herein.

The invention claimed is:

1. A brain-machine interface system, comprising:
a monitoring device, comprising at least one sensor adapted to detect brain signals;

a processor, in communication with the monitoring device, wherein the processor is configured to analyze the signals detected by the at least one sensor, the processor comprising:
a classification module, the classification module being configured to:
  arrange the received brain signals in time-windows of symmetrically overlapping sample windows with temporal sequence latencies repeating at larger factors per window to receive a predefined number of unique windows for a second of brain signals;
  filter the brain signals in the sample windows to transform the signals wavelet by convolution of the signal; and
  classify brain states corresponding to the analyzed signals based on the filtered sample windows; and
a user interface, coupled to the processor, the user interface to execute commands corresponding to a deduced state from the classification module,
wherein the processor is further configured to detect brain signals corresponding to imaginary movement.

2. The system of claim 1, wherein the monitoring device is wearable and configured to fit onto the head of a subject.

3. The system of claim 1, comprising a plurality of sensors that are spatially distributed at the monitoring device.

4. The system of claim 1, wherein the processor further comprises a signal acquisition module to receive signals detected by the at least one sensor and to transfer the signals to pre-processing module.

5. The system of claim 1, further comprising at least one memory module to store at least some of the detected data.

6. The system of claim 1, wherein the classification module comprises a multi-class support vector machine (SVM) classifier.

7. The system of claim 1, wherein the communication between the processor and the monitoring device is wireless.

* * * * *